(12) United States Patent
Hedler et al.

(10) Patent No.: US 8,035,220 B2
(45) Date of Patent: Oct. 11, 2011

(54) SEMICONDUCTOR PACKAGING DEVICE

(75) Inventors: Harry Hedler, Germering (DE); Sven Rzepka, Dresden (DE)

(73) Assignee: Qimonda AG, Munich (DE)

( * ) Notice: Subject to any disclaimer, the term of this patent is extended or adjusted under 35 U.S.C. 154(b) by 0 days.

(21) Appl. No.: 11/966,968

(22) Filed: Dec. 28, 2007

(65) Prior Publication Data
US 2009/0102035 A1     Apr. 23, 2009

(30) Foreign Application Priority Data
Oct. 22, 2007   (DE) .................. 10 2007 050 433

(51) Int. Cl.
*H01L 23/14*     (2006.01)
(52) U.S. Cl. ......... 257/702; 257/E23.172; 257/E21.002; 438/780
(58) Field of Classification Search .......... 257/747, 257/748, 702, 678, 686, 713, E23.172, E23.08, 257/E21.002; 438/106, 125, 780
See application file for complete search history.

(56) References Cited

U.S. PATENT DOCUMENTS

| | | | |
|---|---|---|---|
| 6,194,788 B1 | 2/2001 | Gilleo et al. | |
| 6,323,436 B1 | 11/2001 | Hedrick et al. | |
| 6,329,603 B1 | 12/2001 | Japp et al. | |
| 6,399,426 B1 | 6/2002 | Capote et al. | |
| 6,722,031 B2 | 4/2004 | Japp et al. | |
| 7,109,061 B2 | 9/2006 | Crane et al. | |
| 7,221,059 B2 | 5/2007 | Farnworth et al. | |
| 7,382,060 B2 | 6/2008 | Farnworth et al. | |
| 7,417,325 B2 | 8/2008 | Farnworth et al. | |
| 2001/0003058 A1 | 6/2001 | Gilleo et al. | |
| 2002/0024138 A1* | 2/2002 | Shimoto et al. | 257/753 |
| 2002/0031868 A1 | 3/2002 | Capote et al. | |
| 2002/0050402 A1 | 5/2002 | Japp et al. | |
| 2002/0089067 A1 | 7/2002 | Crane et al. | |
| 2005/0135067 A1* | 6/2005 | Park et al. | 361/715 |
| 2005/0181540 A1 | 8/2005 | Farnworth et al. | |
| 2005/0200028 A1 | 9/2005 | Farnworth et al. | |
| 2005/0238967 A1* | 10/2005 | Rogers et al. | 430/5 |
| 2006/0003569 A1 | 1/2006 | Farnworth et al. | |
| 2006/0037359 A1 | 2/2006 | Stinespring | |
| 2006/0118953 A1 | 6/2006 | Farnworth et al. | |
| 2006/0183349 A1* | 8/2006 | Farnworth et al. | 438/792 |
| 2007/0020916 A1 | 1/2007 | Farnworth | |

FOREIGN PATENT DOCUMENTS

| | | |
|---|---|---|
| DE | 10 2004 056 534 A1 | 6/2006 |
| KR | 20010045280 | 6/2001 |
| KR | 20010105641 | 11/2001 |
| WO | WO 2006/056153 A1 | 6/2006 |

OTHER PUBLICATIONS

Doi. Hiroaki, Semiconductor Package, Nov. 20, 1991, JP 403290952A (japanese patent No.).*

* cited by examiner

*Primary Examiner* — Thomas L Dickey
*Assistant Examiner* — Nikolay Yushin

(57) ABSTRACT

Embodiments of the invention relate to a semiconductor module and to a method for manufacturing a semiconductor module. In an embodiment of the invention, a semiconductor module for mounting to a board may include at least an integrated circuit having connections on at least one side of the integrated circuit, and at least a first layer which is applied to the side of the integrated circuit having the connections, wherein the free surface of the first layer facing away from the integrated circuit has a thermo-mechanical linear expansion in the in-plane direction of the surface which corresponds to the thermo-mechanical linear expansion of the board to which the semiconductor module is to be mounted.

18 Claims, 17 Drawing Sheets

FIG 6

| Material | Young's modulus [GPa] | CTE [μm/(m K)] | Note |
|---|---|---|---|
| Silicone | 0.003 ... 0.010 | 230 ... 350 | Generic data |
| Silicone, Molded, Glass Fiber Filled | 0.042 | 60 | MatWeb |
| Henkel MN1339-77B | 0.110 | 131 | Supplier data |
| DuPont Teflon 9B Granular Molding Powder | 0.345 | 79 | MatWeb |
| Ablestick Ableflex 6202C | 0.400 | 180 | Tg is close to RT |
| Daikin M-12 POLYFLON PTFE | 0.500 | 100 | MatWeb |
| Ablestick Ablebond 2025D | 0.700 | 138 | Tg is close to RT |
| Polymethylpentene (PMP) | 1.000 | 50 | MatWeb |
| Lintec LE5000 | 1.660 | 80 | Supplier data |
| Shinetsu SFX513J | 2.200 | 94 | Measurement CL 2006 |
| Taiyo (SM) PSR-4000AUS308 | 2.620 | 90 | Measurement CL 2005 |
| DuPont Kapton-H | 2.960 | 18 | Supplier data |
| WPR 5200 | 3.400 | 53 | Measurement CL 2007 |
| WPR 1201 | 4.200 | 47 | Measurement CL 2005 |
| Nagase (underfill) R3003 | 9.000 | 30 | Supplier data |

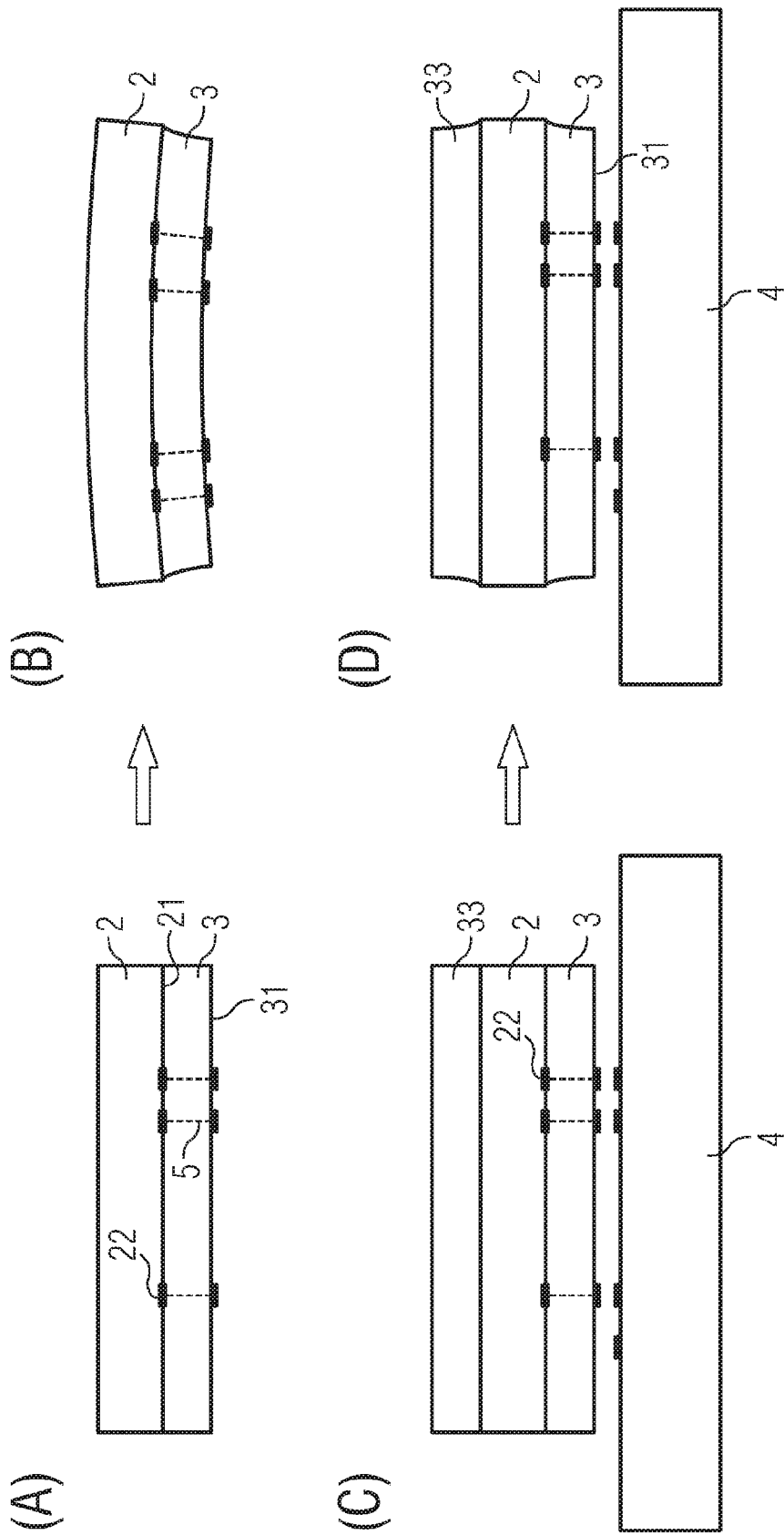

FIG 8
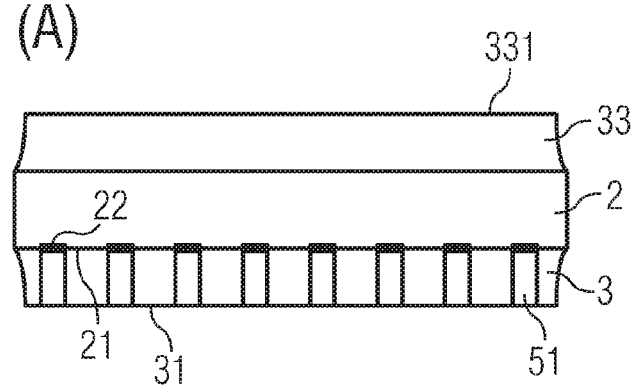
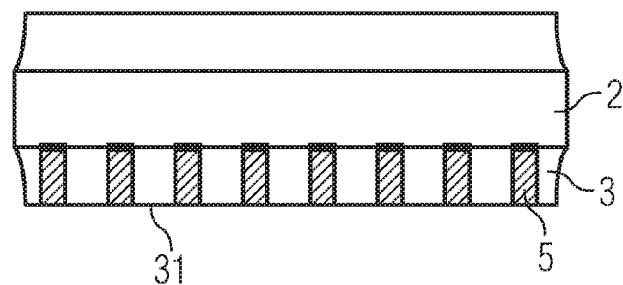
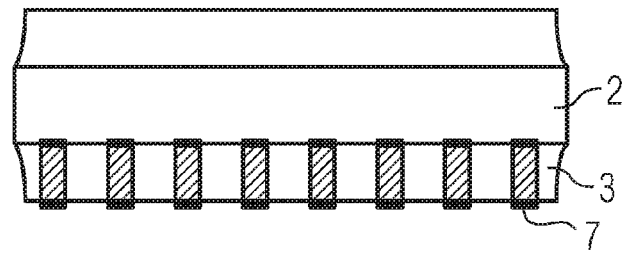
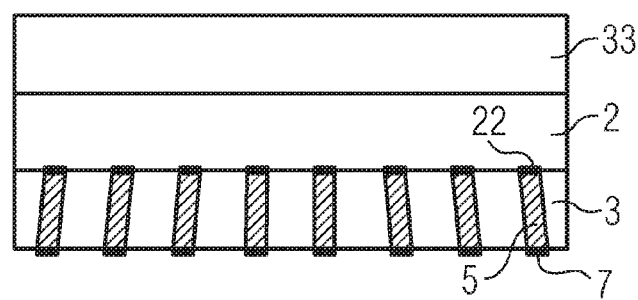

FIG 9
(A)
(B)
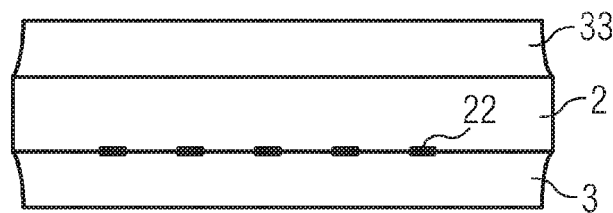
(C)
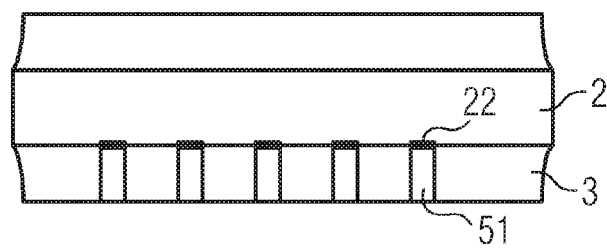
(D)
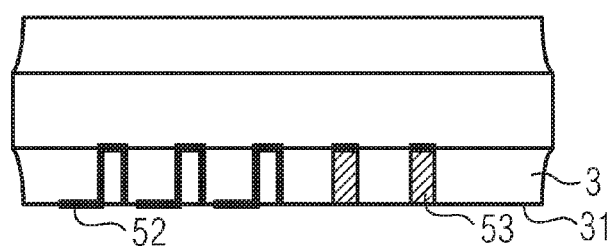
(E)
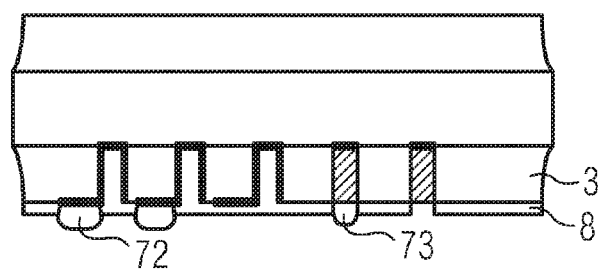

FIG 10
(A)
(B)
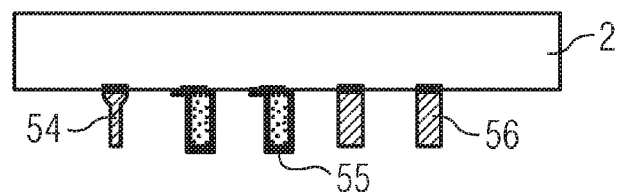
(C)
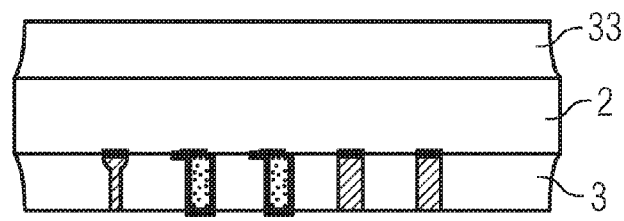
(D)
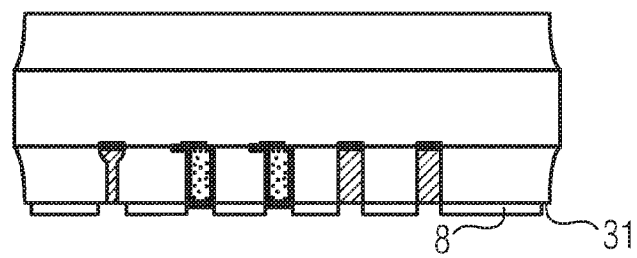
(E)
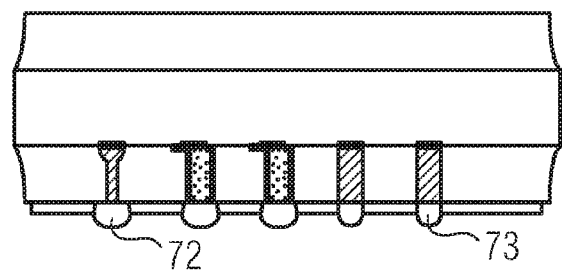

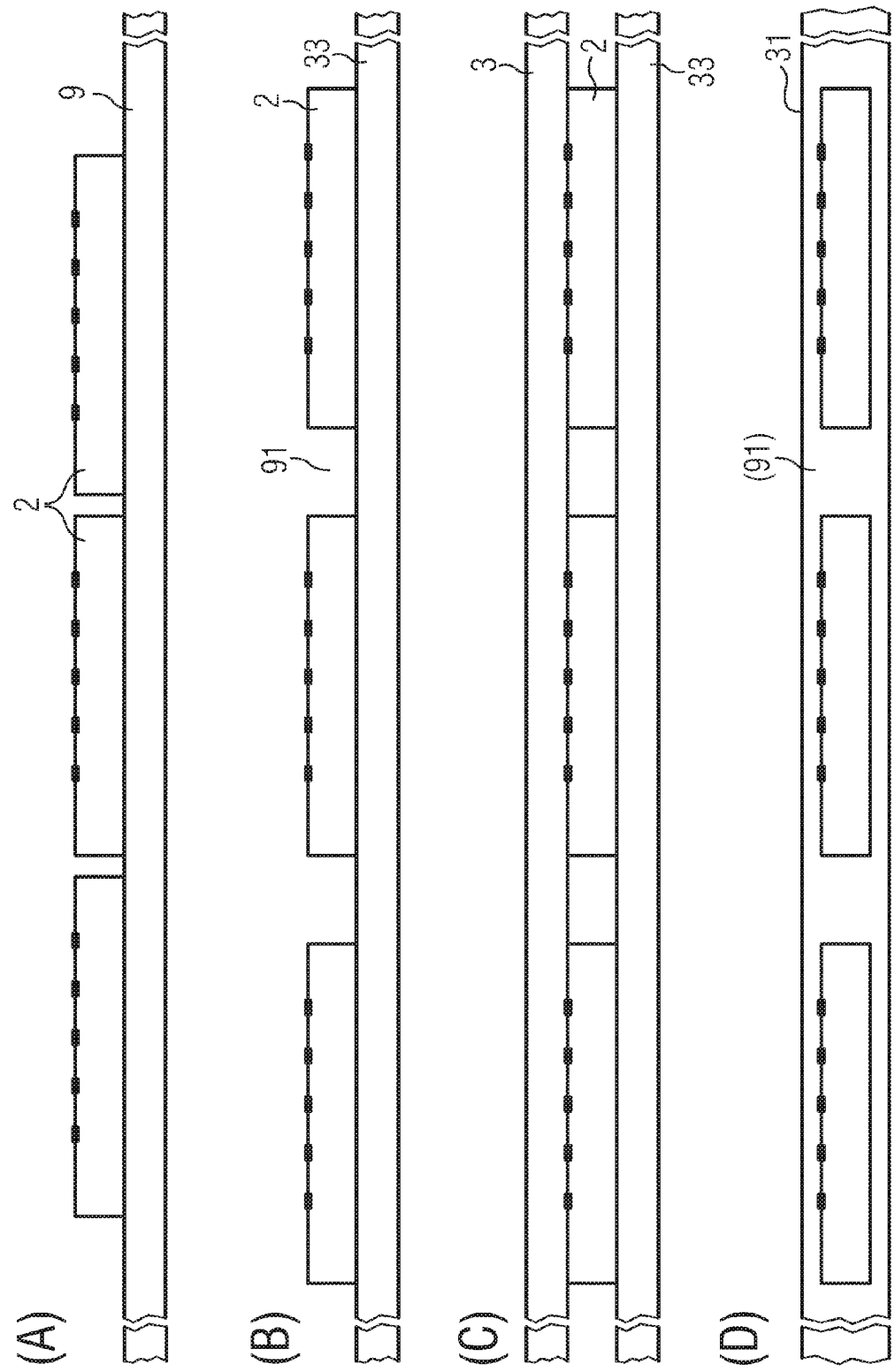

FIG 11
(E) 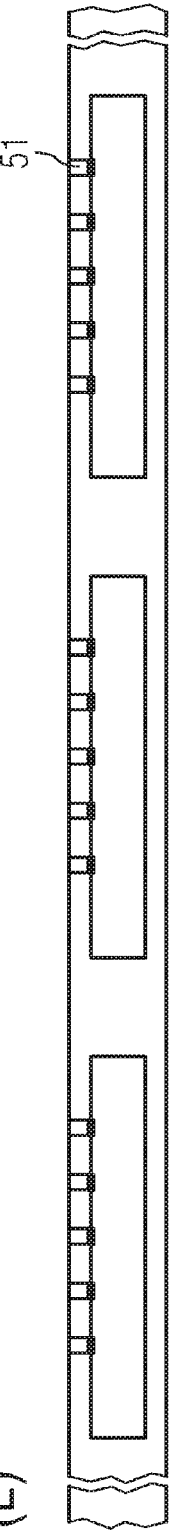
(F) 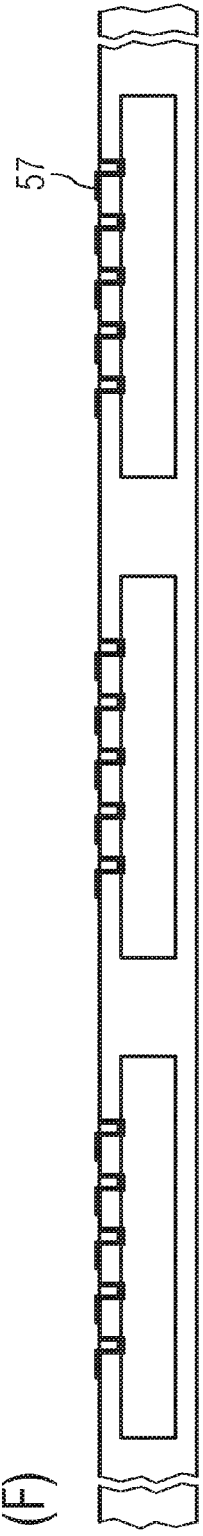
(G) 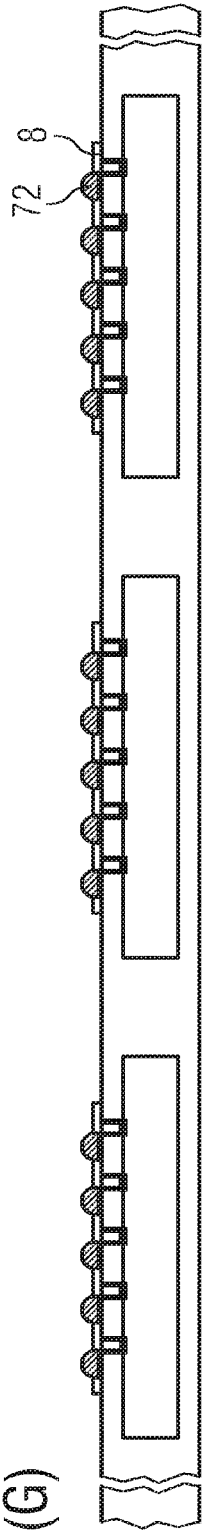
(H) 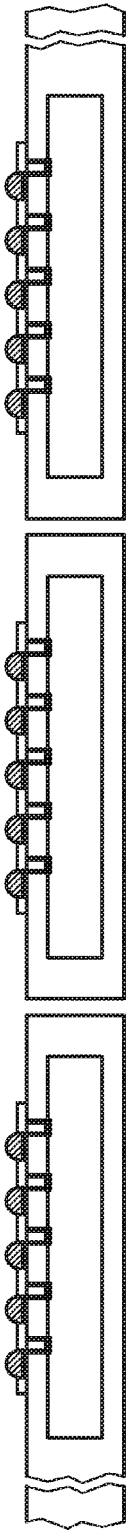

FIG 12
(A) 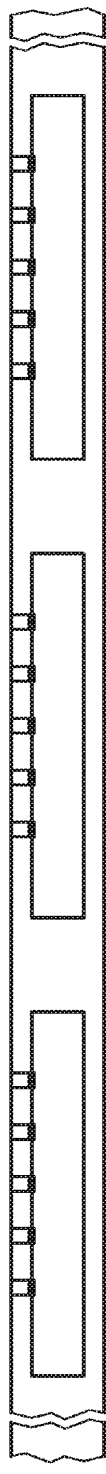
(B) 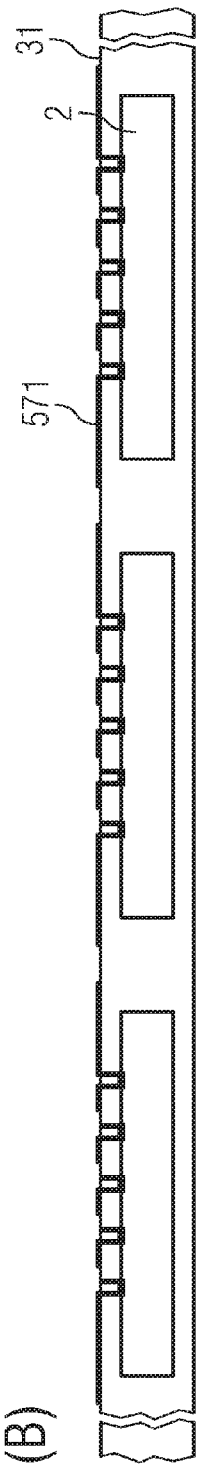
(C) 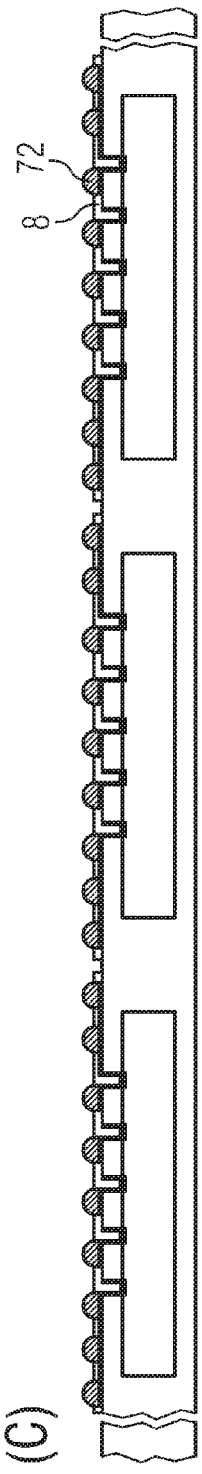
(D) 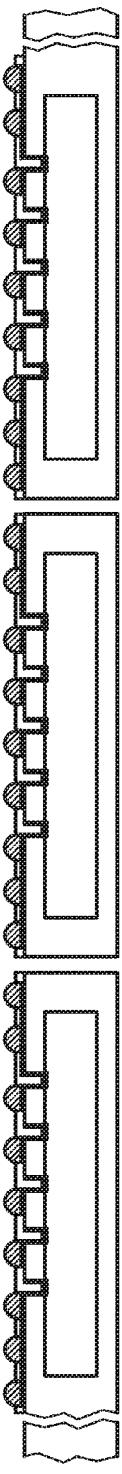

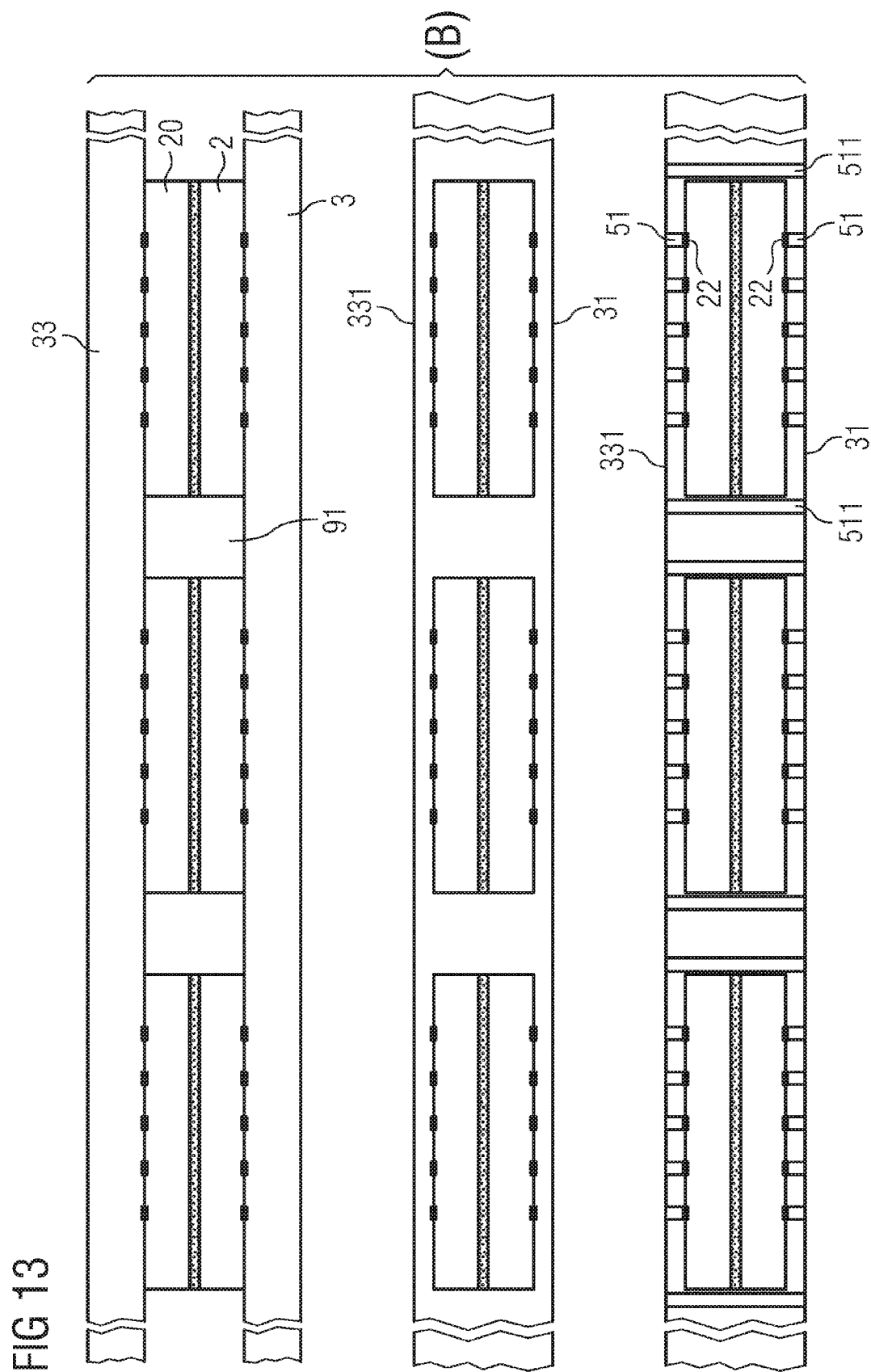

FIG 13
(C) 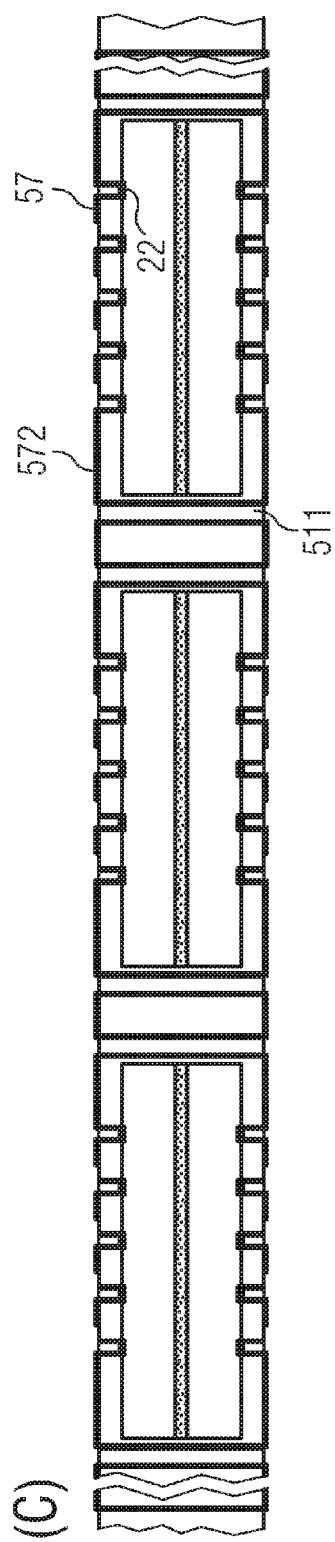
(D) 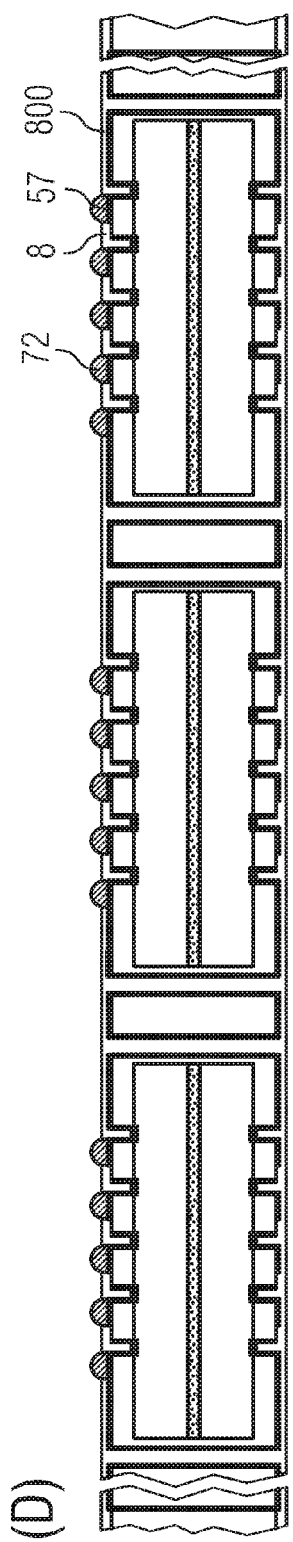
(E) 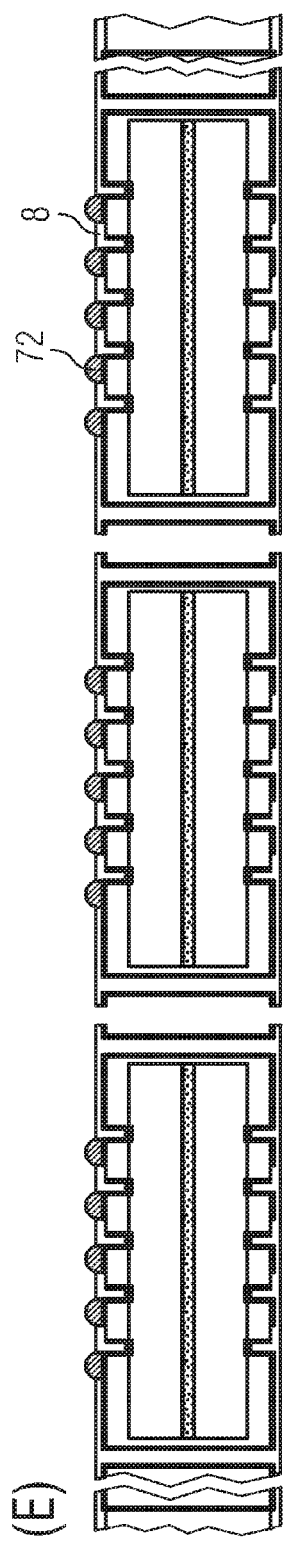

FIG 14
(A)
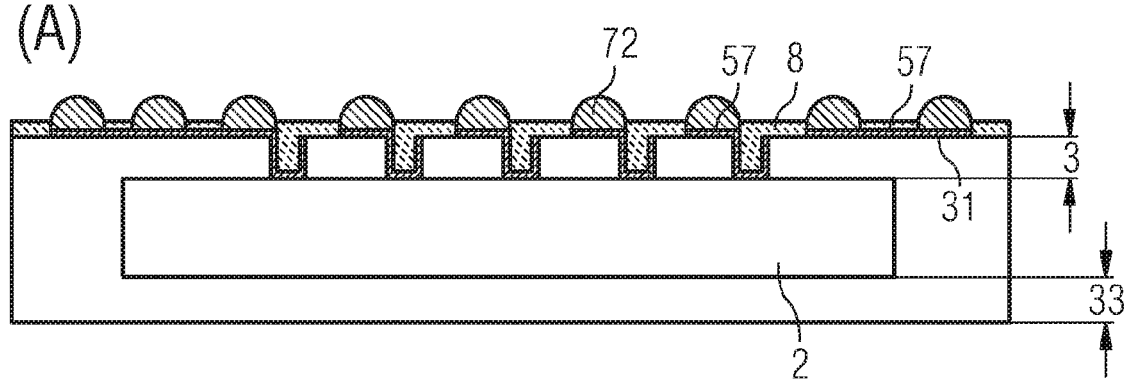
(B)
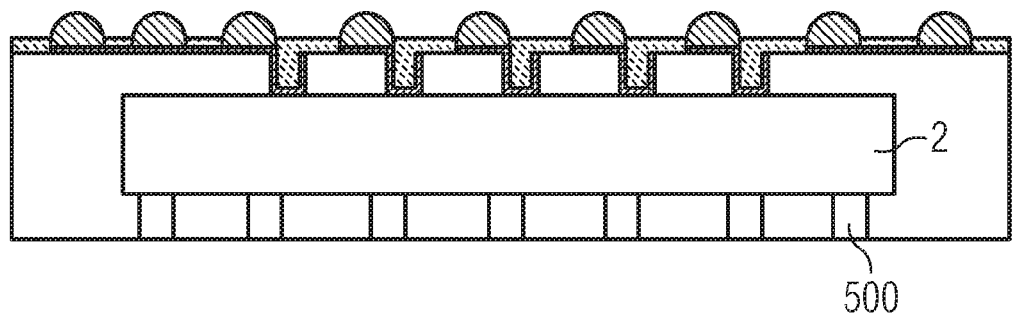
(C)
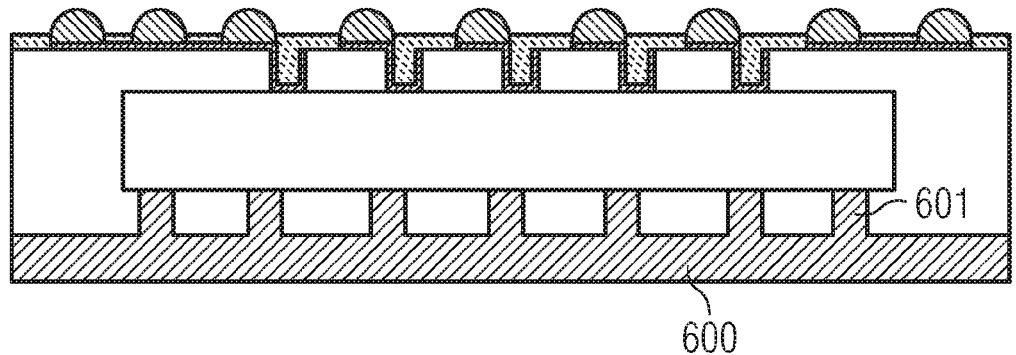

SEMICONDUCTOR PACKAGING DEVICE

This application claims priority to German Patent Application 10 2007 050 433.2, which was filed Oct. 22, 2007 and is incorporated herein by reference.

TECHNICAL FIELD

Embodiments of this invention relate generally to semiconductor packaging technology. More particular embodiments relate to a semiconductor packaging device that is resistant to bowing as a function of temperature.

BACKGROUND

Semiconductor modules, such as semiconductor chips provided with a package, which for electrically connecting, for example, with a circuit board, are provided with connections, which are, for example, provided in the form of solder bumps, should be very reliable. Thus, the semiconductor modules should not only be reliable with regard to their function but also a reliable lasting contacting connection with, for example, a circuit board, should be ensured.

One of the problems with semiconductor modules is the thermo-mechanical adaptation of the integrated circuits and semiconductor chips (mostly silicon), respectively, to the next level, i.e., for example to a printed circuit board (PCB). This problem exists due to the coefficients of thermal expansion (CTEs) of the materials being different from each other. The material of a conventional printed circuit board (PCB), for example, an adaptation to copper, has a CTE of approximately 15 ppm/K to 16 ppm/K, and the CTE of silicon is of approximately 3 ppm/K.

This is the reason why a plurality of different types of packages has been created to reduce the thermo-mechanical stress factor. In some of the package types, a substrate is used as an intermediate element (such as, for example, ball grid array (BGA), flip chip in package), by which it is attempted to balance the thermo-mechanical mismatch within the arrangement to be as low as possible at a certain range of temperature. However, in the case of using packages accommodating bare dies (wafer level package), the situation becomes increasingly critical due to the fact that the chips are arranged in very close contact to the board of the next level.

Consequently, one challenge for the packaging industry is to produce packages for integrated circuits, such as bare dies with a low complexity, which are very reliable, have small dimensions, and can be produced at low costs.

In flip-chip packages (FCiPs), for example, a plurality of functional elements is included to fulfill all package functions and to provide a balance with regard to the thermo-mechanical stress adaptation between chip/substrate and substrate/board. For this purpose, for example, the following are provided: solder balls on the chip (sometimes using a redistribution level); bonding of the chips to the substrate by using underfill; the substrate itself, large ball grid array (BGA) solder balls to realize the electrical and mechanical connection to the next level; and mold compound as backside and edge protection.

In the case of wafer level packages (WLPs) the crossing of critical material parameters (mainly with regard to the CTE) is the greatest challenge: between the chip and the next level often only BGA solder balls are arranged; in the case of a necessary redistribution of the chip pads often a dielectric buffer layer is used; and pillars under the solder balls are known, which increase the distance or gap between the chip and the substrate.

WLPs of a greater size (distance to the neutral point of the balls (DNP) >3 mm to 4 mm) are not reliable enough for most applications due to stress-induced internal cracks.

SUMMARY OF THE INVENTION

A semiconductor module for mounting on a board is described. The semiconductor module may include an integrated circuit and a first layer. The integrated circuit may include at least one side of the integrated circuit and connections on at least one side of the integrated circuit. The first layer may be applied to the side of the integrated circuit that has the connections, wherein the free surface of the first layer facing away from the integrated circuit has a thermo-mechanical linear expansion in the in-plane direction of the surface that corresponds to the thermo-mechanical linear expansion of the board onto which the semiconductor module is to be mounted.

As an example, the semiconductor module may be manufactured utilizing a fabrication process. The method may include forming a layer at least on a side of an integrated circuit having at least a connection, wherein the layer has a polymer material and the layer is applied to the integrated circuit depending on the coefficient of thermal expansion and the Young's modulus of the polymer material with such a thickness that the free surface of the layer facing away from the integrated circuit is arranged with a thermo-mechanical linear expansion in the in-plane direction of the surface, which corresponds to the thermo-mechanical linear expansion of a board onto which the semiconductor module is mounted.

Other systems, methods, features and advantages of the invention will be or will become apparent to one with skill in the art upon examination of the following figures and detailed description. It is intended that all such additional systems, methods, features and advantages be included within this description, be within the scope of the invention, and be protected by the accompanying claims.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various implementations of the invention are described with reference to the following drawings, in which:

FIG. 6 shows a material overview table for usable materials according to an example;

FIG. 7 shows a semiconductor module according to an example;

FIG. 8 shows a process diagram for manufacturing a semiconductor module according to an example;

FIG. 9 shows a semiconductor module according to an example;

FIG. 10 shows a process diagram for manufacturing a semiconductor module according to an example;

FIG. 11 shows a process diagram for manufacturing a semiconductor module according to an example;

FIG. 12 shows a process diagram for manufacturing a semiconductor module according to an example;

FIG. 14 shows a semiconductor module according to an example.

DETAILED DESCRIPTION OF ILLUSTRATIVE EMBODIMENTS

In this description the terms "connected," "linked" and "coupled" are used for describing a direct connection as well as an indirect connection, a direct link or indirect link, and a direct coupling or an indirect coupling. In the figures, identical or similar elements are provided with identical reference numbers, inasmuch as this is appropriate.

Figure 1:
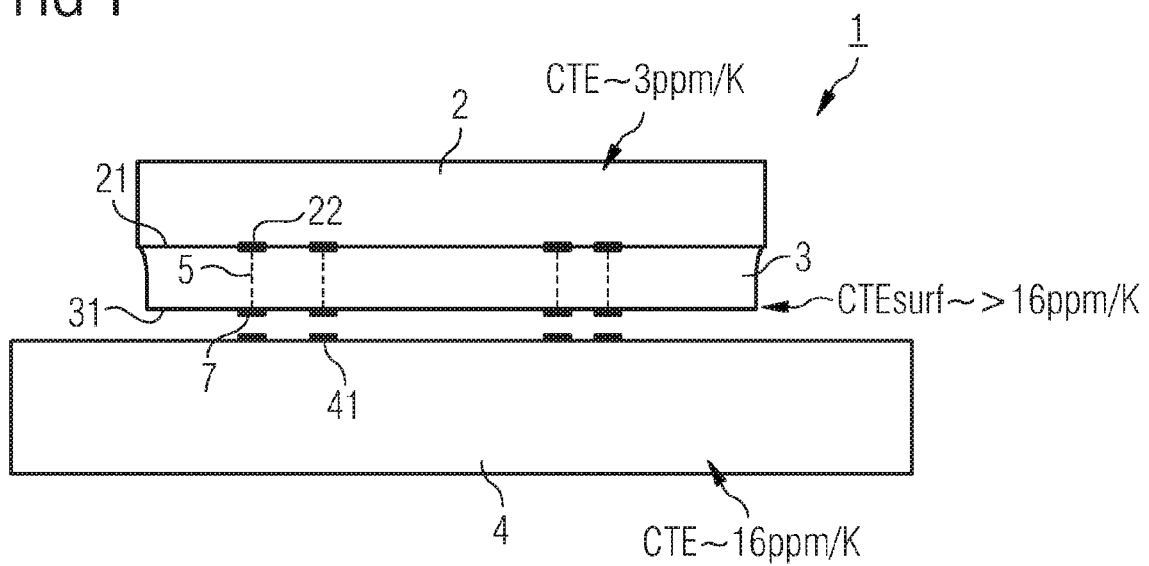
FIG. 1 shows a semiconductor module according to an implementation.

FIG. 1 shows a semiconductor module according to an implementation.

On the basis of the semiconductor module 1 schematically shown in FIG. 1, an exemplary implementation will be explained in more detail below.

According to this implementation, the semiconductor module 1 includes an integrated circuit, for example in the form of a semiconductor chip 2. The semiconductor chip 2 includes on its one side 21, which is for example also referred to as active side 21, a plurality of electrical connections in the form of connection pads 22. A first layer 3 is applied to the side 21 on which the connection pads 22 are formed. The first layer 3 may, for example, include a certain polymer material. Electric lines 5 are guided from the connection pads 22 through the first layer 3 to the free surface 31 of the first layer 3. Moreover, contact pads 7 are arranged on the free surface 31 of the first layer 3, which are conductingly connected with the ends of the electric lines 5 exposed on the surface 31 of the first layer 3. On the contact pads 7, for example, solder balls 7 may be disposed. A semiconductor module 1 configured in such a manner may, for example, be connected to a board 4, for example in the form of a printed circuit board, wherein the, for example, solder balls 7 can be soldered with contact pads 41 of the board 4. In order to avoid, in the case of temperature changes, damages of, for example, the soldered connections that may occur due to shear forces due to the different thermo-mechanical linear expansions of the materials of the first layer 3 and the board 4, the free surface of the first layer 3 facing away from the semiconductor chip 2 has a thermo-mechanical linear expansion in the in-plane direction of the surface 31, which corresponds to the thermo-mechanical linear expansion of the board 4. With such a measure, it can be achieved that no shear forces due to different strong linear expansion of the materials act on the contact elements disposed between the fixed first layer 3 and the board 4 in the case of changes in temperature, because the free surface 31 of the first layer 3 and the board 4 behave in the same manner with regard to their linear expansion in the case of temperature changes.

Unlike with conventional solutions, where, for example, relatively large solder balls were used for connecting a semiconductor module for example to a circuit board, to ensure that the different linear expansions of the semiconductor module and the board were to be balanced or absorbed, in a semiconductor module according to an implementation, smaller solder balls can be provided on the semiconductor module, because in the case of temperature changes almost no shear forces act on these soldered connections. In addition, this allows the provision of more connections on the semiconductor module, because, due to the decrease in the size of the solder balls, there is the possibility of arranging more solder balls or contact pads (lands) in a closer grid on the semiconductor module.

As indicated in FIG. 1, the board 4 according to an implementation has a coefficient of thermal expansion (CTE) of approximately 15 ppm/K to 16 ppm/K, and the semiconductor chip 2, which according to this implementation is a silicon chip, has a CTE of approximately 3 ppm/K. The thickness of the layer 3, which according to this implementation may include a polymer material, is selected such that it includes on its free surface 31 facing away from the semiconductor chip 2 a CTE in the in-plane direction of the surface 31 with a value of approximately 16 ppm/K. In other words, the value of the thermo-mechanical linear expansion in the in-plane direction of the free surface 31 of the first layer 3, namely CTE~15-16 ppm/K is substantially equal to the value of the thermo-mechanical linear expansion of the board 4, which is also of CTE~15-16 ppm/K. This implementation allows an almost stress-free connection between the surface 31 of the layer 3 facing the board 4, for example, in the form of a circuit board, and the board 4, because the surface 31 of the layer 3 and the board 4 have almost the same thermal expansion behavior.

Figure 2:
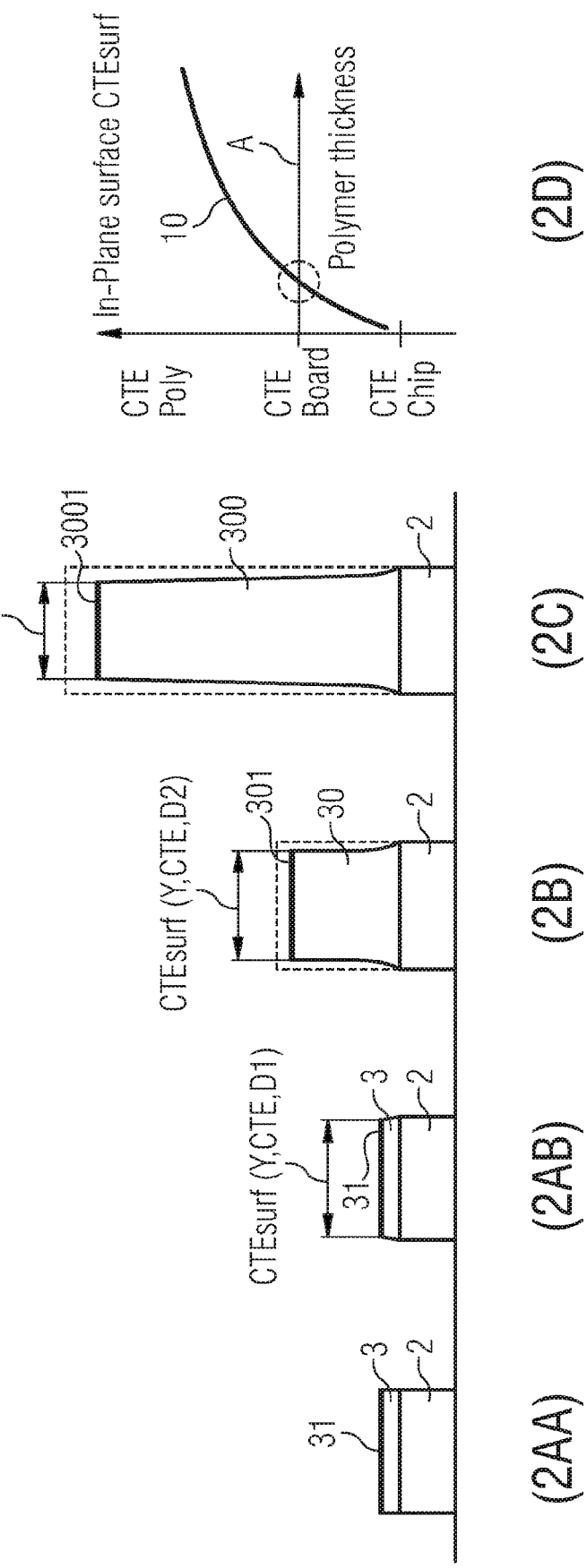
FIG. 2 shows a schematic view, wherein one implementation of the invention is shown.

Obtaining the knowledge as to how a stress-reduced semiconductor module (package) may be configured that has thermo-mechanical properties that are adapted to thermo-mechanical properties of a carrier of the next level, i.e., for example, of a circuit board, was for example preceded by considerations which are explained on the basis of the schematic view in FIG. 2. It has been considered which thermo-mechanical linear expansion in the in-plane direction of the surface had a free surface of a layer of polymer fixed to a chip or a wafer.

For the sake of simplicity, when explaining the illustrations in FIG. 2 reference is always made to an integrated circuit in the form of a chip 2.

In FIG. 2AA, a chip 2 is shown with a thin polymer layer 3 on the upper side of the chip 2, the thin polymer layer 3 being shown in a state as it occurs after applying the thin polymer layer 3 at a higher temperature. Thus, the peripheral edge of the layer 3 is aligned substantially flush with the side edges of the chip 2, and the area of the free surface 31 of the layer 3 substantially corresponds to the area of the surface of the chip 2 to which the layer 3 is applied. Under changed temperature conditions, i.e., at a temperature lower than the temperature according to FIG. 2AA, the free surface 31 of the layer 3 is in the in-plane direction only minimally lower, as can be seen from FIG. 2AB. Due to the fact that the layer 3 is formed to be thin relative to the chip 2, the possibility of the thermo-mechanical linear change of the free surface 31 of the layer 3 in the in-plane direction of the free surface 31 is limited and almost equal to the CTE of the chip 2.

If a polymer layer 30, which is in comparison thicker than the thin polymer layer 3 in FIG. 2AB, is applied to a chip 2, as it is shown in FIG. 2B at equal temperature conditions as according to FIG. 2AB, it has been observed that the linear coefficient of thermal expansion (CTE) of the free surface 301 of the layer 30 has in the in-plane direction of the free surface ($CTE_{surface}$) approximately a value ranging between the CTE of the chip ($CTE_{bulk}$) and the CTE of the polymer material ($=CTE_{polymer-bulk}$), because there is less influencing of the layer 30 by the chip 2 than in the implementation according to FIG. 2AB because of the relatively large distance of the surface of the chip 2 to the free surface 301 of the polymer layer 30.

According to FIG. 2C, an extremely thick polymer layer 300 was applied to the chip 2, shown with the same temperature conditions as according to FIG. 2AB and FIG. 2B. In this regard, it could be mentioned that the coefficient of thermal expansion (CTE) of the free surface 3001 of the layer 300 has in the in-plane direction of the free surface ($CTE_{surface}$) approximately a value being in the range of the CTE of the polymer material (=$CTE_{polymer-bulk}$). Thus, the free surface 3001 of the layer 300 can in the in-plane direction of the free surface 3001 consequently move almost freely without the influence of the chip 2 according to the CTE of the polymer.

The layers 3, 30, and 300 shown in FIG. 2 each may include for the consideration described above the same polymer material with special inherent material properties, i.e., a material-specific Young's Modulus Y (also referred to as elastic modulus E) and a material-specific coefficient of thermal expansion (CTE).

In FIG. 2D, the dependence of the thermo-mechanical linear expansion in the in-plane direction of a free surface ($CTE_{surface}$) of a polymer layer (3, 31, 300) which is fixed on a chip 2 is schematically shown by a diagram as a function of the thickness of the polymer layer. It can be seen from the curve 10 in the illustration according to FIG. 2D that the thermo-mechanical linear expansion in the in-plane direction of the free surface ($CTE_{surface}$) changes as the layer thickness increases. After the thermo-mechanical linear expansion in the in-plane direction of the free surface ($CTE_{surface}$) of the polymer layer fixed on the chip being close to the CTE of the chip in the case of a small thickness, the value of the thermo-mechanical linear expansion in the in-plane direction of a free surface ($CTE_{surface}$) increases constantly as the thickness of the polymer layer increases. The characteristic line A is further inserted as a reference in the diagram as the value for the CTE of the board, the value of which is of about 16 ppm/K in a conventional board, wherein the point of intersection between the characteristic line A for the board ($CTE_{Board}$) and the curve 10 indicates the value for the thickness of the layer of polymer which the layer includes, if the thermo-mechanical linear expansion in the in-plane direction of the free surface includes a value which corresponds to the CTE of the board.

From this consideration the knowledge could be gained that the thermo-mechanical linear expansion in the in-plane direction of a free surface ($CTE_{surface}$) can be set as a function of the thickness of a one-sided fixed or attached layer, for example, of polymer, and of the Young's Modulus of the material used for the layer. From this it follows that there is for each layer of, for example, polymer, a material-specific Young's Modulus and a material-specific CTE, attached for example to a chip, a value for the thermo-mechanical linear expansion in the in-plane direction of the free surface of the layer, which can be adapted by setting/defining the layer thickness to the value of the CTE of a board (for example in the form of a printed circuit board).

From this it follows that for the adaptation of the thermo-mechanical linear expansion in the in-plane direction of the free surface of a layer attached for example to a chip, two material parameters are important, namely the coefficient of thermal expansion (CTE) and the Young's Modulus (Y) of a special material, wherein the layer is to be applied to the chip with a thickness, such that the value for the thermo-mechanical linear expansion in the in-plane direction of the free surface of the layer ($CTE_{surface}$) corresponds to the CTE of the material from which the respective board is to be produced.

Figure 3:
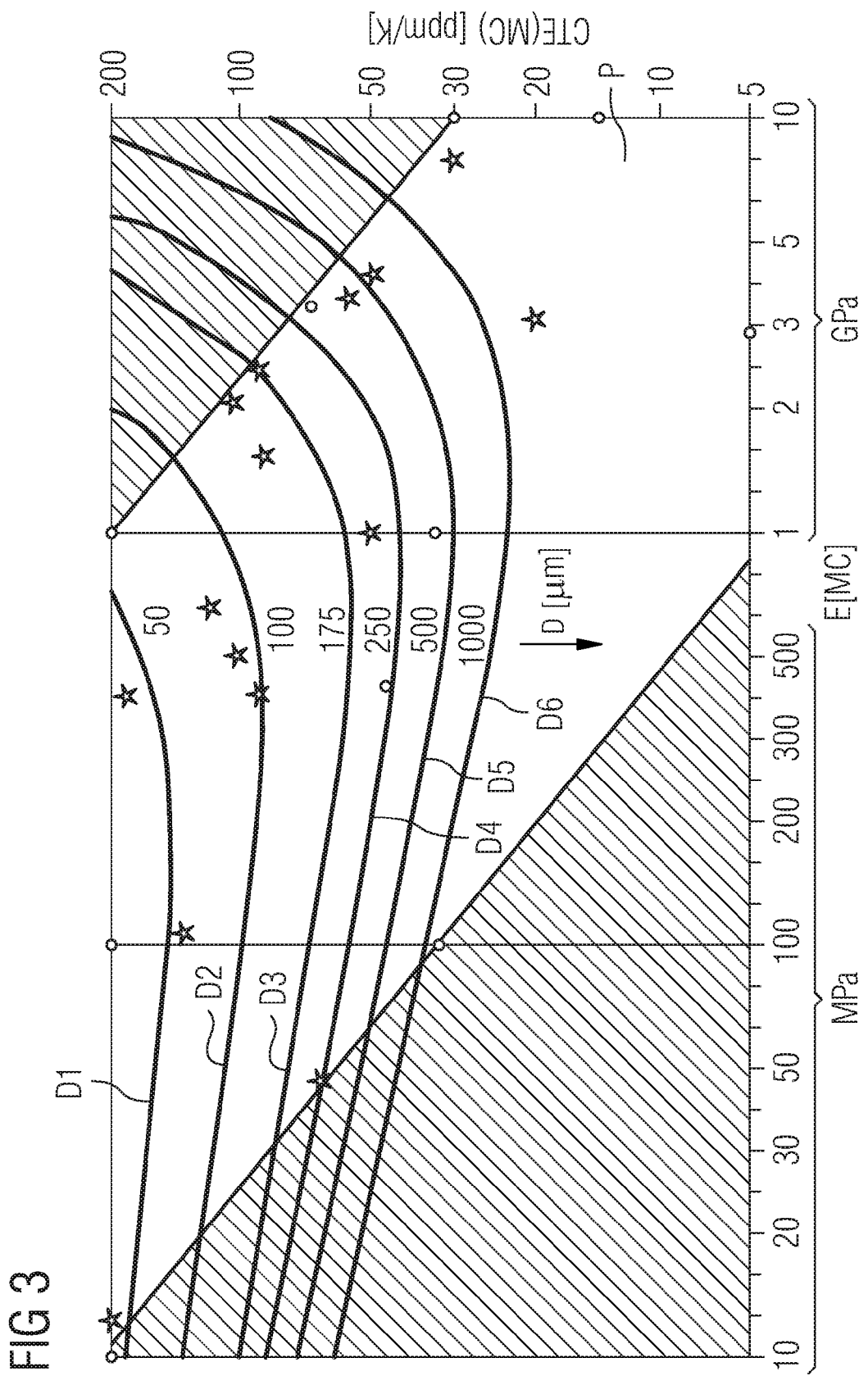
FIG. 3 shows a material characteristic diagram.

Accordingly, in FIG. 3 a characteristic diagram is schematically shown, in which on the horizontal line values are indicated with regard to the Young's Modulus and wherein on the vertical line values are indicated with regard to the CTE, wherein the parameter space designated with P shows in which polymers are actually existent. The characteristic lines D1 to D6 respectively show the thickness (in µm) that a one-sided fixed layer of a certain material has to include depending on the concrete elasticity module (Young's Modulus) and the concrete coefficient of thermal expansion (CTE) of the same, such that the layer has a thermo-mechanical linear expansion in the in-plane direction of the free surface of 16 ppm/K. Thus, the exemplary characteristic lines D1 to D6 inserted in the characteristic view each display values with regard to the layer thickness, which have each been calculated on the basis of a Young's modulus value, a CTE value and that defined CTE value which is to be achieved on the surface of the layer in the in-plane direction and which in this case corresponds to the CTE for example of a printed circuit board with a value of 16 ppm/K. If for example considerations are to be based on a material having a Young's modulus of 1 GPa and a CTE of approximately 43 ppm/K, the polymer layer, for example, on the chip should have a thickness of approximately 250 µm, such that the coefficient for the thermo-mechanical linear expansion in the in-plane direction of the free surface of the layer is of 16 ppm/K, as it can be seen from the characteristic diagram. Each material has a certain CTE and a certain Young's modulus, i.e., that these two coefficients have no material parameters independent from each other. In the illustration of FIG. 3, a star "*" respectively indicates examples of polymer materials that are commercially available.

Figure 4:
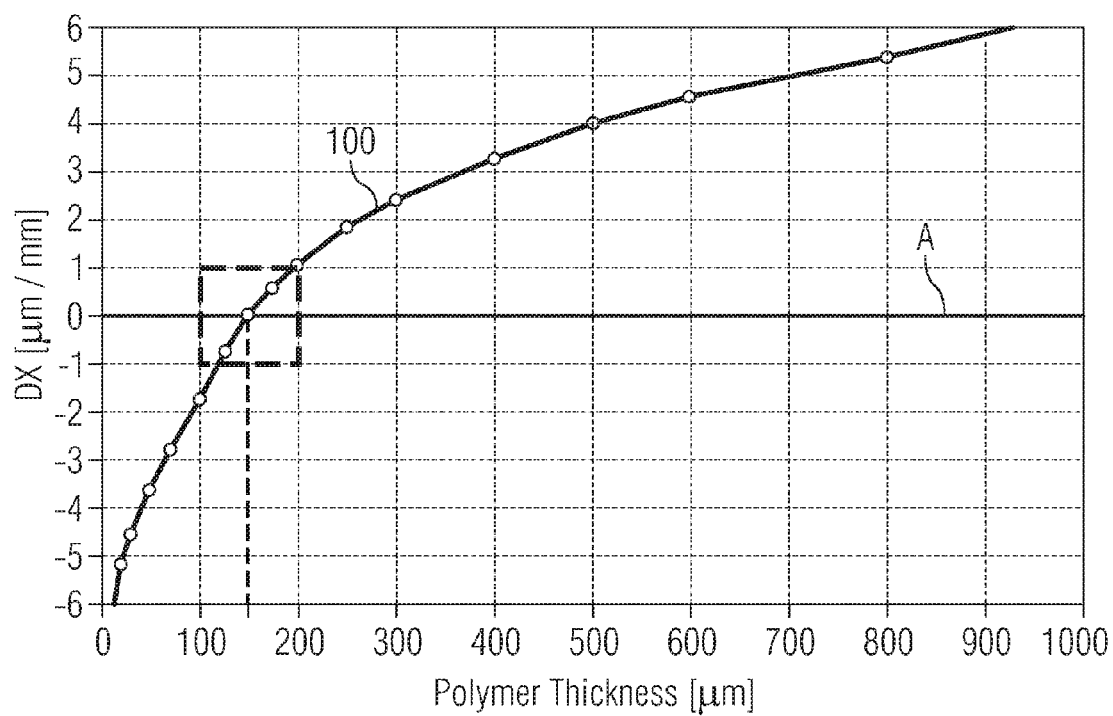
FIG. 4 shows an example of a usable material according to the invention.

One example of a concrete material can be seen from FIG. 4. In this regard, this is a product of the manufacturer Toray with the product name TSA15 which has a material-specific CTE of 67 ppm/K and an elasticity module E (Young's modulus) of 266 MPa and which is provided in the form of a lamination foil. From the curve 100 in the illustration of FIG. 4 the thermo-mechanical linear expansion in the in-plane direction of the free surface can be read which changes depending on the thickness of the layer applied for example to a chip. In this regard, the line A in FIG. 4 indicates a CTE of 16 ppm/K which corresponds to the CTE of a conventional board and to which the thermo-mechanical linear expansion in the in-plane direction of the free surface of the layer or foil is to be adapted. As can be seen from the curve 100 in FIG. 4, the CTE of the free surface in the in-plane direction of the surface has in the case of a layer thickness of a few µm according to this implementation a value which is substantially lower than that of the board (line A), because the expansion possibility of the free surface is limited with such a small thickness due to the adhesion of the layer to the chip. As the layer thickness increases the CTE of the free surface in the in-plane direction of the surface increases until it finally reaches the CTE of the board (line A), cf. in FIG. 4 the intersection point of line A and the curve 100. If the point of intersection of line A and curve 100 is projected onto the coordinate with the indications with regard to the thickness of the polymer layer, the corresponding layer thickness, in this regard of approximately 150 µm, can be read. From this it follows that the free facing away surface of the polymer film layer containing TSA15 has a thermo-mechanical linear expansion in the in-plane direction of the surface which corresponds to the thermo-mechanical linear expansion of the board, i.e., approximately 16 ppm/K, if the polymer layer has a thickness of approximately 150 µm.

If again the material characteristic values of the product with the product name TSA15, i.e., the CTE of 67 ppm/K and the elasticity module E (Young's modulus) of 266 MPa are transferred to the characteristic diagram according to FIG. 3, the same result is obtained, according to which the polymer layer should be applied to an integrated circuit with a thickness of approximately 150 μm, in order that the free surface of the polymer layer has a thermo-mechanical linear expansion in the in-plane direction of the surface which corresponds to the thermo-mechanical linear expansion of the board intended for mounting the integrated circuit, which in this implementation is of approximately 16 ppm/K.

Figure 5:
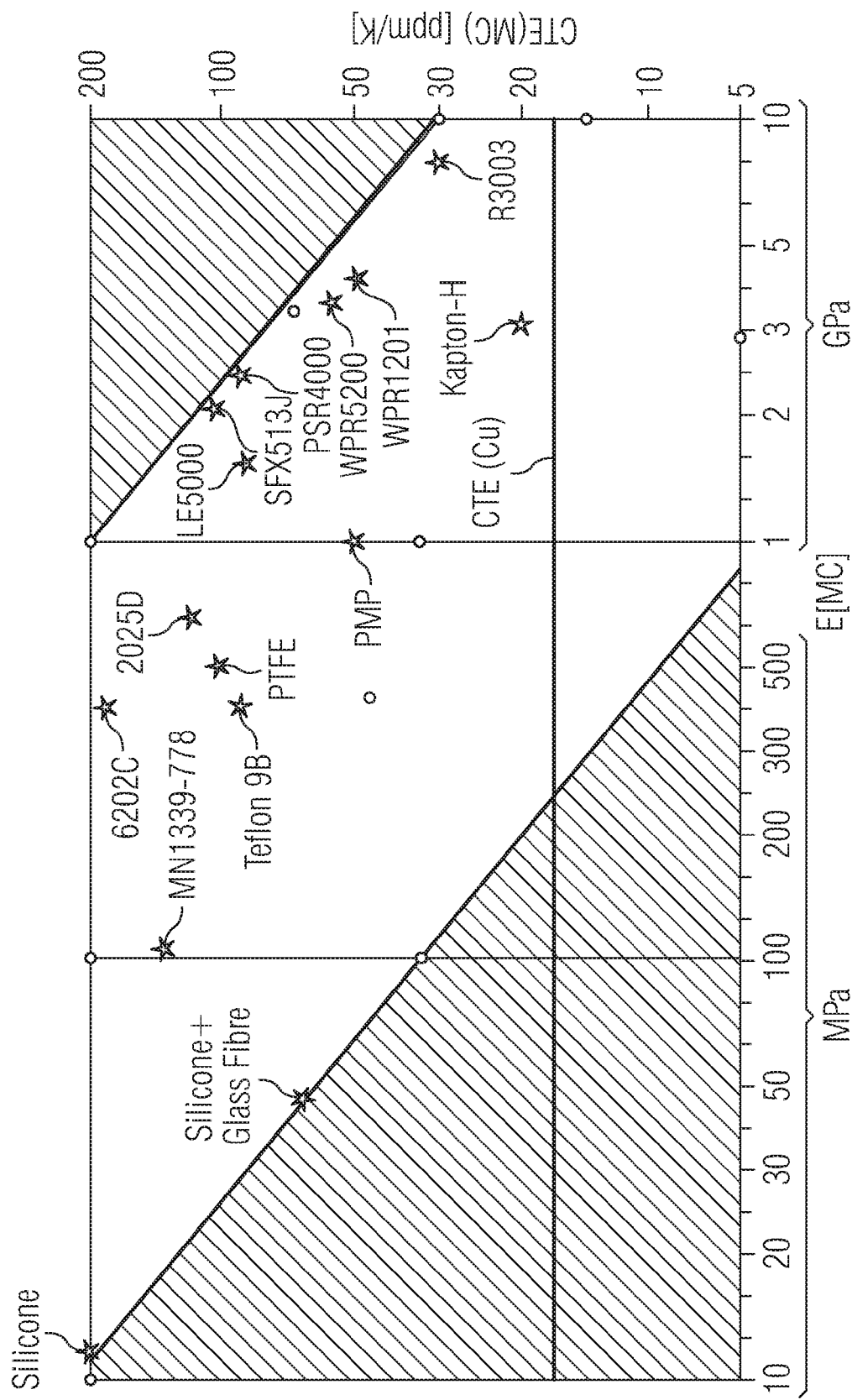
FIG. 5 shows another material characteristic diagram.

FIG. 5 substantially corresponds to the characteristic view according to FIG. 3, wherein in FIG. 5 a selection of materials is inserted in the parameter space designated with P, which are each marked with a star "*" and provided with their product name. For the purpose of clarity an overview of the materials entered in FIG. 5 is contained in FIG. 6.

According to another implementation, another layer is applied to the side of the integrated circuit facing away from the connections in addition to the one layer which is applied to the side of the integrated circuit including the connections and the free surface of which facing away from the integrated circuit has a thermo-mechanical linear expansion in the in-plane direction of the surface that corresponds to the thermo-mechanical linear expansion of the board onto which the semiconductor module is mounted, wherein the surface of the second layer facing away from the integrated circuit has for example a thermo-mechanical linear expansion in the in-plane direction of the surface that corresponds to the thermo-mechanical linear expansion of the free surface of the first layer.

In FIG. 7A for example a semiconductor module is shown with a semiconductor chip 2 and a polymer layer 3 applied to the side 21, having the connections 22, of the semiconductor chip 2, the free surface of which includes for example a thermo-mechanical linear expansion in the in-plane direction of the surface 31 which corresponds to the thermo-mechanical linear expansion of a board (not shown), wherein the semiconductor module in FIG. 7A is shown in a state under increased temperature, such as a curing temperature, in which state the semiconductor chip 2 and the polymer layer 3 are in a balanced state with regard to their thermo-mechanical linear expansion. If the semiconductor module according to FIG. 7A is cooled down to room temperature, it can happen due to the layer 3 being for example thicker than the semiconductor chip 2 and due to the chip 2 having a lower CTE than the polymer layer 3, that the semiconductor chip 2 and thereby the entire semiconductor module 2 are bent due to the greater thermo-mechanical length change (here shrinking) of the polymer layer 3, as can be seen from FIG. 7B.

In order to avoid this, another layer 33, hereinafter also referred to as second layer 33, can for example be applied also to the side of the semiconductor chip facing away from the connections 22 as well, as it is shown in FIG. 7C, wherein the semiconductor module in FIG. 7C having the two layers 3 and 33 is shown in a state under increased temperature, such that the layers 3 and 33 and the semiconductor chip 2 are in a balanced state, and the second layer 33 consequently serves for stress balancing with regard to the first layer 3. If the semiconductor module according to FIG. 7C is cooled down to room temperature, the semiconductor chip 2, the first layer 3 and the second layer 33 remain flat and are not bent, as can be seen from FIG. 7D, because, by the second layer 33, the bending stress generated by the first layer 3 and acting on the semiconductor chip 2 (cf. FIG. 7B) is balanced. By arranging the first layer 3 described above in more detail on the semiconductor layer 2 and by additionally arranging the second layer 33 on the semiconductor chip 2, for example, a package, for example for bare chips or dies, can be provided, which is not subject to any bows or warps in the case of a change in temperature, and by which after arranging for example on a board 4 furthermore a bending-stress-free connection between the board 4 and the semiconductor module (or package) is ensured even in the case of temperature changes, because the free surface 31 of at least the first layer 3 facing the board 4 includes a thermo-mechanical linear expansion in the in-plane direction of the surface which corresponds to the thermo-mechanical linear expansion of the board 4.

However, the second layer 33 applied to the side of the semiconductor chip 2 facing away from the connections 22 can also be configured in a manner different from the manner described, i.e., it is not mandatory that the free surface of the second layer 33 facing away from the semiconductor chip 2 includes a thermo-mechanical linear expansion in the in-plane direction of the surface that corresponds to that of the first layer 3, as long as the second layer 33 is suitable for balancing a bending of the semiconductor module to be expected by the first layer 3 in the case of a temperature change. Thus, the second layer 33 can be configured substantially for compensating the bending force potentially applied to the integrated circuit or the semiconductor chip 2 by the first layer 3 in the case of temperature changes.

Even if the implementation of a semiconductor module described according to FIG. 7 has been described by a semiconductor chip 2, it should be understood that the integrated circuit of each of the explained implementations, which is provided with the first layer or with the first layer and the second layer, can also be a so-called chip stack, wherein the lines between the stacked chips are guided directly through, for example, the silicon (from the front side to the backside) (thru-Si-via stacking). Such a chip stack can also be provided on the wafer level. In the case of, for example, a chip stack/wafer stack, the described first layer can be arranged on that side of the chip stack/wafer stack that is provided for bonding with the next level, such as a circuit board. Optionally, the second layer can then be arranged on the side of the chip stack/wafer stack facing away from the first layer.

According to another implementation, which is shown in FIG. 8, a semiconductor module having for example an integrated circuit in the form of a semiconductor chip 2 may include the first layer 3 which for example includes the features described according to FIG. 1, the second layer 33, and at least one electric line 5, which is guided by one of the connections which are formed in the form of connection pads 22 on the semiconductor chip 2 through the first layer 3 to the free surface 31 of the same. According to an implementation, the semiconductor chip 2 may include a plurality of connection pads 22, of which a corresponding plurality of electric lines 5 are guided through the layer 3 to the free surface 31 of the layer 3 (FIG. 8B). According to an implementation, the electric line 5 may include a material that has a coefficient of thermal expansion which is similar to the coefficient of thermal expansion of the material of the first layer 3.

In FIG. 8A the semiconductor module is shown with the semiconductor chip 2 and the first layer 3 and the second layer 33 under room temperature conditions, wherein it can be seen that the first layer 3 and the second layer 33 respectively starting from the connection level with the semiconductor chip 2 in the direction towards the free surfaces 31 and 331, respectively, includes a shrunk cross-section.

As can further be seen from FIG. 8A, the first layer 3 first includes a plurality of vias 51 which respectively extend from a connection pad 22 of the semiconductor chip 2 through the layer 3. These vias 51, for example, may have been inserted in the layer 3 by laser, by photo lithography or by dry-etching.

As can be seen from FIG. 8B, for example a conductive material is inserted in these vias 51, from which the lines 5 for electrically conductingly connecting the semiconductor module with a next level, for example in the form of a printed circuit board (not shown), can be formed.

Finally, contact elements 7, for example in the form of solder pearls or contact surface pads, can be applied to the end portions of the lines 5 being exposed on the free surface 31 of the layer 3, as can be seen from FIG. 8C.

If, according to FIG. 8C, the semiconductor chip 2 is subject to a temperature change, i.e., to a temperature increased relative to the room temperature, an at least slight deformation of the polymer layer 3 occurs due to the thermal expansion of the same in x-direction, in y-direction as well as in z-direction, i.e., the thicker the polymer layer 3 the greater the deformation of the same. In relatively large semiconductor chips for example, in which vias 51 in the polymer layer 3 can comprise a relatively large distance to the neutral point (DNP), the deformation of the polymer layer 3 can produce undesired effects to the connection between the semiconductor chip and the board, by at least a residual stress component remaining between the semiconductor element and the board despite stress-free connections for example by solder connections. In other words, apart from the already described length change of the free surface 31 of the polymer layer 3 also a particular material movement occurs within the layer, wherein the vias 51 in the polymer layer 3 are, apart from a slight deformation in x-direction and in y-direction, also subject to a deformation in z-direction, i.e., are extended, such that the vias 51 are formed to be slightly curved at an increased temperature.

In FIG. 8D the semiconductor module according to FIG. 8C is shown at a higher temperature which, for example, can correspond to the maximum operation temperature, wherein it can be seen that the first layer 3 as well as the second layer 33, which are applied to the semiconductor chip 2, have at this increased temperature experienced a temperature expansion respectively in x-direction, y-direction and z-direction. As already described, the lines 5 also have a temperature expansion, wherein the lines 5 have been extended in particular in z-direction.

In order also to provide a stress-free connection between the connection pads 22 of a semiconductor module 2 and, for example, the solder balls 7 on the free surface 31 of the polymer layer 3, a suitable material is used for lines 5 (connections) according to an implementation, the material properties of which are adapted to the material properties of the polymer material with regard to elasticity and thermal expansion, such that the line material can follow the expansion of the polymer material and can further also receive the occurring shear force/shear stress. That is, the line material should have a thermal expansion, i.e., a CTE, which lies in the range of the CTE of the polymer material of the layer 3 (important for the expansion behavior in the z-direction), and the Young's modulus of which is not greater than the Young's modulus of the polymer material of the layer 3, such that the line 5 or the line material has a greater or at least an equal elasticity and the line 5 can receive a shear stress or shear force acting laterally on the line 5, without the line 5 being destroyed.

If, for example, a polymer film material with a CTE of approximately 60 ppm/K is used for the layer 3 (for example, Toray TSA15, the e-module of which is of approximately 270 MPa), an electrically conducting filling material can, for example, be used for the lines 5, the CTE of which substantially corresponds to the CTE of the polymer film material and the e-module (or Young's modulus) of which is not greater than that of the polymer film material of the layer 3. Consequently, as a filling material, for example, a silver paste with the product name X-43-5603-7 of the manufacturer ShinEtzu is suitable, which has a CTE of approximately 55 ppm/K and an e-module of less than 50 MPa.

With a semiconductor module according to the implementation shown in FIG. 8D, the at least first layer 3 of which has the properties of the layer 3 described by referring to FIG. 1, and in which the lines 5 guided from the contact pads 22 of the semiconductor chip 2 through the layer 3 to the free surface 31 of the same are made of a material, the CTE of which substantially corresponds to the CTE of the polymer layer material, and the e-module of which is not greater than the e-module of the polymer layer material, consequently a product, for example, in the form of a packaged chip, can be provided, which stands out by a simple package structure (first and second layers), great operation security (adaptation to the thermo-mechanical linear expansion of the first layer forming the package to the material of the next mounting level), a small geometry and lower manufacturing costs.

In FIG. 9 another implementation of a semiconductor module is described.

According to this implementation as a first step (A) an integrated circuit is provided in the form of a grinded wafer, die or chip 2, which has on its one side 21 exposed connection pads 22. Typically, the integrated circuit 2 has a thickness of approximately 50 µm to approximately 300 µm.

In a next step (B) the integrated circuit, i.e., for example, the chip 2, is provided on its active side 21, i.e., on the side on which the connection pads 22 are arranged, with a polymer layer 3, and it is provided on its inactive side with a polymer layer 33. The application of the polymer layers 3 and 33 can, for example, occur by lamination of polymer films or by wet coating, such as for example spraying, spin coating or printing. It shall be understood that at least the polymer layer 3 includes on its free surface facing away from the chip 2 (integrated circuit) a thermo-mechanic linear expansion in the in-plane direction of the surface, which corresponds to the thermo-mechanical linear expansion of the board, to which the semiconductor module is to be mounted. The polymer layer 33 can be provided as an anti-stress-layer.

Then, as it is shown in view (C), vias 51 are generated through the polymer layer 3, wherein for example respectively one via or through hole 51 extends from one of the connection pads 22 of the chip 2. The corresponding vias can for example be produced by laser, photo lithography or dry etching technology.

Then, as it is illustrated in view (D), connections between the connection pads 22 of the chip 2 and pads on the free surface 31 of the polymer layer 3 are realized. These connections or lines can, for example, be produced in the form of thin film lines 52 or for example by filling the vias 51 with a metal 53, such as for example solder, or a conducting polymer material 53. Then, in this implementation illustrated in view (E), a solder stop layer 8 can be applied to the free surface 31 of the polymer layer 3, before, for example, solder balls 72 or 73 are applied to the exposed end portions of the thin film lines 52 or to the exposed end of the metal forming the lines or of the conducting polymer.

Referring now to FIG. 10 a semiconductor module according to another implementation will be explained.

According to this implementation as a first step (A) again an integrated circuit, for example in the form of a grinded wafer, die or chip 2, is provided, which has on its one side 21 exposed connection pads 22. Typically, the integrated circuit has a thickness of approximately 50 µm to approximately 300 µm.

According to a next step (B) the connection pads 22 of the chip 2 are coupled with electrically conducting line portions which are formed in the form of stud wire bonds 54, by thin film line portions 55 arranged on pedestals, by metal studs 56, for example, from copper, or by solder studs.

Then, as it is shown in view (C), the coating of the chip 2 with the polymer layer 3 and with the polymer layer 33 occurs, which can be carried out, for example, by a molding process or by lamination of polymer film, wherein the already generated line portions (54 or 55 or 56) are formed into the polymer material. In this regard it is intended that the end portions of the line portions facing away from the connection pads 22 remain free from the polymer or are subsequently exposed.

Then, as it is shown in view (D), a solder stop layer 8 can correspondingly be applied to the free surface 31 of the polymer layer 3 before, for example, solder balls or solder bumps 72 or 73 are arranged on the exposed end portion of the corresponding line portions (54 or 55 or 56), as it is shown in view (E).

Referring now to FIG. 11 another exemplary implementation will be described with regard to manufacturing a semiconductor module.

After all process steps have been carried out for example on the wafer level, a wafer can be singulated into dies 2, wherein the wafer for example rests on a dicing tape 9 with its one side for singulating, as it is shown in view (A).

The next process step (B) may include for example the removing of the single dies of chips 2 from the dicing tape 9 and the subsequent positioning or depositing on a polymer film 33, wherein the chips 2 are positioned face-up, i.e., with the active side upwards and at a distance between each other on the polymer film 33, according to this implementation. According to another implementation, which is not shown, the chips 2 can also first be deposited face-down on a polymer film 33.

In the subsequent step (C) another polymer film 3 may be applied by lamination to the active upper side of the plurality of chips 2.

In the following step (D) the two polymer films 3 and 33 which rest on the active or on the inactive sides of the chips 2 may be pressed together under heat for example by a hydraulic squeezing machine used in the PWB technology, wherein the pressing occurs in such a controlled manner that as a result the polymer layer 3 on the active chip side and for example also the polymer layer 33 on the inactive chip side have such a predetermined layer thickness, that for example the free surface 31 of the polymer layer 3 assigned to the active side of the chip 2 is configured with a thermo-mechanical linear expansion in the in-plane direction of the surface 31, which corresponds to the thermo-mechanical linear expansion of a board to which the semiconductor module is to be mounted finally. By the pressing of the two polymer layers 3 and 33 under heat for example a melting of the polymer material occurs, such that components of the polymer material are displaced in the gaps 91 between chips 2 adjacent to each other, wherein the polymer material displaced into the gaps 91 enters into a homogeneous connection.

Then, in the next step (E), for example the already described production of vias 51 through the polymer layer 3 covering the connection pads 22 occurs.

Then, in step (F), a redistribution 57 of the exposed connection pads 22 of the chip 2 may occur for example by thin film or thick film technology, such as sputtering, electroplating or lithographing.

Then, in step (G), the application of a solder stop layer 8 and then the arranging of contact elements for example in the form of solder balls 72 can occur.

In step (H) a singulating of the chips 2 embedded in the polymer material into single semiconductor modules occurs by separating the entire arrangement respectively in the area between chips 2 positioned next to each other.

By the manner of manufacturing described in FIG. 11, a plurality of chips 2 can be processed into semiconductor modules in one level, i.e., at the same time.

Referring now to FIG. 12 another exemplary implementation will be described with regard to the manufacturing of a semiconductor module.

The arrangement shown in view (A) of FIG. 12 corresponds for example to the arrangement described in connection with the view (E) according to FIG. 11, such that there is no need for an additional explanation with regard to view (A) in this context.

Unlike the arrangement in view (F) of FIG. 11, the production of a redistribution 571 of the exposed connection pads 22 of the chips 2 (also in this case for example by thin film or thick film technology, such as sputtering, electroplating or lithographing), however, is carried out such that portions of the redistribution 571 along the surface 31 of the polymer layer 3 are guided to those areas which extend over the edges of the chip 2 embedded in the polymer (fan-out region).

Subsequently, in step (C) the application of a solder stop layer 8 and then the arranging of contact elements in the form of, for example, solder balls 72 can occur, also in this regard in the fan-out regions.

In step (D) the singulating into single semiconductor modules of the chips 2 embedded into the polymer material occurs.

Figure 13:
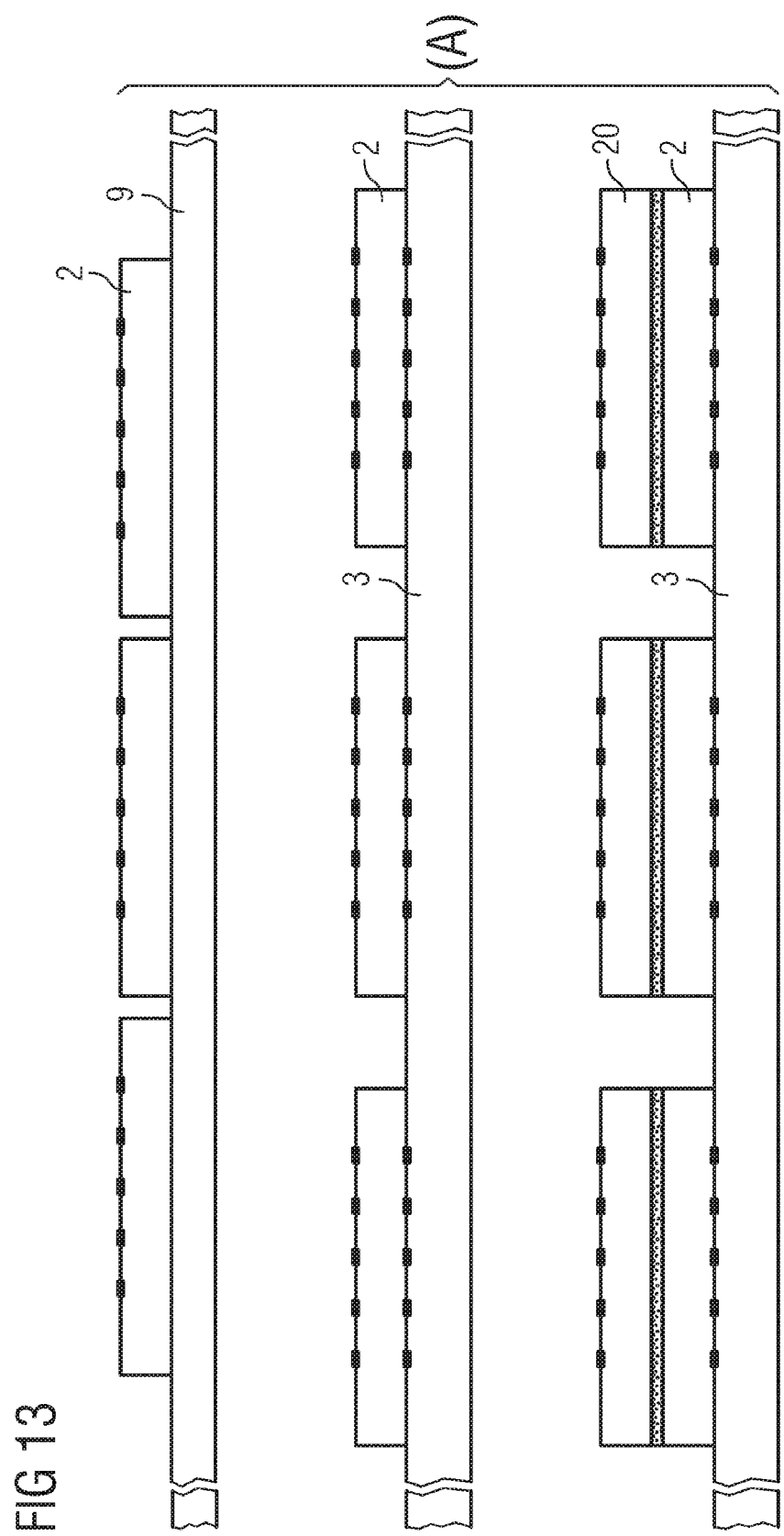
FIG. 13 shows a process diagram for manufacturing a semiconductor module according to an example.

Referring now to FIG. 13 another implementation will be described in more detail.

According to the sequence of steps in view (A) of FIG. 13, first the singulating of one wafer into single dies or chips 2 occurs, then the chips 2 are removed from the adhesive tape 9, the chips are placed in this case face-down on a polymer film 3 (cf. also the sequences of steps according to views (A) and (B) in FIG. 11), and then another chip 20 is attached for example respectively to one of the chips 2 arranged on the polymer film 3, such that the respectively one further chip 20 faces with its inactive side the inactive side of the chip 2. The chips 2 and 20 can for example be connected by adhesion. Consequently, with this arrangement a chip stack having two chips 2, 20 connected to each other on inactive sides (back-to-back stack) is provided, which can for example have a total thickness of less than approximately 500 µm.

According to the sequence of steps in view (B) of FIG. 13, another polymer film 33 is applied by lamination to the active exposed side of the plurality of chips 20, wherein the two polymer films 3 and 33 are subsequently pressed together under heat for example by a hydraulic squeezing machine. As it has already been described with regard to the implementation according to FIG. 11, the pressing occurs in such a controlled manner, that as a result the polymer layer 3 as well as the polymer layer 33 have in the area of the respective chips 2 or 20 such a predetermined layer thickness that for example the respective free surface 31 or 331 of the polymer layers 3 and 33 is configured with a thermo-mechanical linear expansion in the in-plane direction of its free surface 31, which for example corresponds for example to the thermo-mechanical linear expansion of a board onto which the semiconductor module is to be mounted. By pressing the two polymer layers 3 and 33 under heat, for example, a melting of the polymer material takes place, such that parts of the polymer material are displaced into the gaps 91 between chip stacks adjacent to each other, wherein the polymer material displaced into the gaps 91 enters into a homogeneous connection. After pressing the two polymer layers 3 and 33 to one package surrounding the chip stack, the production of vias 51 from the free upper sides of the polymer layers 3 and 33 through the same to the connection pads 22 of each of the two chips 2 and 20 occurs. In addition, vias 511 are additionally manufactured, for example by laser, respectively one of which extends from the one surface 31 to the other surface 331 and at a distance laterally next to the respective chip stack.

As can be seen from view (C) of FIG. 13, a redistribution 57 from the connection pads 22 towards the corresponding upper side 31, 331 of the respective polymer layer 3 and 33, respectively and further a connection line 572 is generated, which is guided through the vias 511 and forms an electrically conducting connection between the two chips 2 and 20 of each of the chip stacks. The manufacturing of the redistributions 57 and of the connection lines 572 can for example occur by thin film technology or thick film technology, such as for example by chemical coating or by electroplated coating or by a so-called "conductive plugging," clearly a production of an electrically conductive connection.

As can be seen from view (D) of FIG. 13, a coating of the arrangement for example with a polymer layer 800 then occurs, which substantially covers the redistribution 57 and the connection lines 572, then the polymer layer 800 is opened at the sites of the redistribution 57, where the contact elements are to be arranged, then a solder stop layer 8 is applied and finally small contact elements for example in the form of small solder balls 72 are attached to the exposed portions of the redistribution 57. The application of the single described layers can be carried out by thin film technology or thick film technology, spin coating, spraying or printing. Then, the thereby manufactured arrangement can be singulated into single semiconductor modules by separating at a distance around the chip stack embedded in the unified polymer layer as shown in view (E).

In FIG. 14 another implementation of a semiconductor module is shown.

In view (A) of FIG. 14 a semiconductor module is shown, the manufacturing steps of which have been described in FIG. 12. The chip 2 of the illustrated semiconductor module is substantially entirely accommodated in a package of polymer material. From the connection pads of the chip 2, line portions 57 are guided through the polymer layer 3 covering the chip 2 on its active side to the free surface 31 of the same, wherein the line portions 57 have for example been produced by redistribution technology. Furthermore, on this surface 31 a solder stop layer 8 and a plurality of solder balls 72 can be arranged.

According to view (B) in FIG. 14, the package portion facing away from the active side of the chip 2, i.e., the polymer layer portion 33, includes a plurality of apertures 500 which each extend to the inactive side of the chip 2.

As can be seen from view (C), a cooling body 600 may be arranged to the back side of the semiconductor module, i.e., to the side facing away from the contact elements, which, for example, can be made of a material having very good heat conduction properties. The cooling body 600 according to this implementation may include, for example, a number of projections 601 corresponding to the number of apertures 500, which layers are inserted in the apertures 500. For attaching the cooling body 600 to the semiconductor module, for example additionally an adhesive with good heat conducting properties may be used. Due to the fact that the semiconductor module according to FIG. 14 is provided with the first polymer layer and with the second polymer layer on the integrated circuit or chip 2, which are applied by a molding process or by foil lamination to the integrated circuit, it is ensured that the semiconductor module is not bent under the changing temperature conditions, such that no stresses should be transmitted from the semiconductor module to the cooling element 600, such that the connection between the cooling element 600 and the semiconductor module is consistent and that consequently a permanent good conduction of heat from the chip 2 is ensured.

Even if it was not mentioned in detail, the implementations of a semiconductor module for example described in detail referring to the figures each may include at least on the side of the integrated circuit, on which the connection pads/connections are formed, a polymer layer, the free surface of which facing away from the integrated circuit includes a thermo-mechanical linear expansion in the in-plane direction of the surface, which corresponds to the thermo-mechanical linear expansion of the board, to which the semiconductor module is to be mounted.

In those implementations where also on the other side of the integrated circuit a polymer layer (also referred to as a second layer) is formed, also the surface of this second layer facing away from the integrated circuit may have a thermo-mechanical linear expansion in the in-plane direction of the surface, which for example substantially corresponds to the thermo-mechanical linear expansion of the free surface of the first polymer layer. This second polymer layer can for example serve as a stress balancing layer.

Even if by using the implementations respectively one layer or two layers are mentioned, in this regard one layer or the two layers in connection with the integrated circuit may be understood as a package.

Due to the fact that the semiconductor module according to one of the described implementations has a thermo-mechanical behavior with regard to its linear expansion which is substantially near the thermo-mechanical behavior of the next mounting level, such as a printed circuit board, various effects arise, some of which are hereinafter referred to by way of example.

Since there is almost no stress due to the thermo-mechanical linear expansion of the semiconductor module and the board between the semiconductor module, i.e., the integrated circuit provided with the layer, which can be formed for example in the form of a wafer, a die, a chip or a chip stack, and the board, i.e., the material of the next mounting level, which for example can be formed in the form of a printed circuit board (PCB), almost no, for example, shear forces are applied to the connection or contact elements, such as for example solder balls between the semiconductor module and the board, i.e., the connection or contact elements consequently have nearly no thermo-mechanical function to fulfill. This results in the providing of relatively large solder balls (300 µm to 450 µm) being consequently no longer necessary in a semiconductor module according to an implementation for mechanical reasons. In order to achieve a good thermo-mechanical reliability of the semiconductor module, it is sufficient to provide contact areas for a land grid array (LGA). Thereby, the distance between the semiconductor module and the board can be reduced substantially.

The smaller solder connection elements can be realized by smaller contact area pads on the integrated circuit (for example a chip) and the board (for example a circuit board). For example, the currently usual size of the contact area pads of approximately 250 µm to approximately 350 µm can for example be reduced to approximately 75 µm to approximately 200 µm depending on the number of intended connections. Thereby, more free space, respectively more space for redistribution, can be provided on the integrated circuit as well as on the board between the contact areas, whereby the redistribution becomes easier.

Due to the fact that the, for example, solder balls (or solder pearls or solder bumps) as well as the contact areas can be configured to be smaller, the (parasite) areas causing disturbances are smaller, such that a yield can be achieved with regard to connection parasitic influences due to lower capacitance/inductance.

Since the polymer layer at or on the integrated circuit is relatively thick, there is/are only very weak crosstalk or disturbances in those implementations where a redistribution layer is arranged over the active area of the integrated circuit (i.e., the active chip side).

For memory packages, for example, the contact pads of which are for example arranged along a central line, for which a redistribution can be necessary, the semiconductor module according to an implementation represents an additional functional profit.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. A semiconductor module for mounting on a board, the semiconductor module comprising:
    an integrated circuit having a side with connection pads thereon; and
    a first layer applied to the side of the integrated circuit having the connection pads, the first layer comprising a polymer material having a specific coefficient of thermal expansion, wherein the first layer has such a thickness that a free surface of the first layer facing away from the integrated circuit has a thermo-mechanical linear expansion in an in-plane direction of the free surface that, compared to the specific coefficient of thermal expansion of the polymer material, is modified such that it corresponds to a thermo-mechanical linear expansion of a material of the board onto which the semiconductor module is to be mounted.

2. The semiconductor module of claim 1, wherein the integrated circuit comprises a semiconductor chip.

3. The semiconductor module of claim 1, wherein the integrated circuit comprises a stack of semiconductor chips.

4. The semiconductor module of claim 1, wherein the thickness of the first layer can be predetermined depending on characteristics of the polymer material, the characteristics comprising Young's modulus and the specific coefficient of thermal expansion.

5. The semiconductor module of claim 1, further comprising a second layer which is applied to a side of the integrated circuit facing away from the first layer, the second layer reducing a bending deformation of the integrated circuit due to changes in temperature.

6. The semiconductor module of claim 5, wherein the second layer includes on a free surface facing away from the integrated circuit a thermo-mechanical linear expansion in an in-plane direction of the free surface, which corresponds to the thermo-mechanical linear expansion of the surface of the first layer.

7. The semiconductor module of claim 1, further comprising an electric line that is guided from one of the connection pads through the first layer to the free surface of the first layer.

8. The semiconductor module of claim 7, wherein the electric line includes a material that has a linear coefficient of thermal expansion that is similar to the specific coefficient of thermal expansion of the polymer material of the first layer.

9. The semiconductor module of claim 7, further comprising a contacting element arranged on the free surface of the first layer, the contacting element electrically conductingly coupled with the electric line.

10. A semiconductor module for connecting to at least one board, the semiconductor module comprising:
    two integrated circuits each having an active side with at least one connection pad, the integrated circuits being connected to each other on their inactive sides; and
    respectively one layer on the active side of each of the integrated circuits, each of the layers comprising a polymer material having a specific coefficient of thermal expansion wherein each layer has such a thickness that a free surface of a corresponding layer facing away from the respective integrated circuit has a thermo-mechanical linear expansion in an in-plane direction of the free surface that, compared to the specific coefficient of thermal expansion of the polymer material, is modified such that it corresponds to a thereto-mechanical linear expansion of a material of the at least one board to which the semiconductor module is connected.

11. The semiconductor module of claim 10, wherein each of the integrated circuits comprises a semiconductor chip.

12. The semiconductor module of claim 10, further comprising electric lines, at least one of the electric lines being guided from one of the connection pads of each of the integrated circuits through the respective layer to the free surface of the respective layer.

13. The semiconductor module of claim 12, wherein the electric lines include a material that has a coefficient of thermal expansion that is similar to the specific coefficient of thermal expansion of the polymer material of the layer.

14. A method for manufacturing a semiconductor module configured for mounting onto a board, wherein a material of the board has a specific coefficient of thermal expansion, the method comprising:
    forming a first layer at least on a side of an integrated circuit, the first layer having a plurality of connection pads, wherein the first layer comprises a polymer material and the first layer is applied to the integrated circuit, depending on a coefficient of thermal expansion and a Young's modulus of the polymer material, with such a thickness that a free surface of the first layer facing away from the integrated circuit is arranged with a thermo-mechanical linear expansion in an in-plane direction of the free surface that, compared to the coefficient of thermal expansion of the polymer material, is modified such that it corresponds to a thermo-mechanical linear expansion of the board onto which the semiconductor module is to be mounted.

15. The method of claim 14, further comprising forming a second layer on a side of the integrated circuit facing away from the plurality of connection pads, wherein the second layer is configured to avoid a bending deformation of the integrated circuit due to temperature changes.

16. The method of claim 15, wherein a free surface of the second layer facing away from the integrated circuit is configured with a thermo-mechanical linear expansion in an in-plane direction of a surface which corresponds to the thermo-mechanical linear expansion in the in-plane direction of the free surface of the first layer.

17. The method of claim 14, further comprising:
    manufacturing vias through the first layer, the vias aligned with the plurality of connection pads; and
    forming electric lines in the vias.

18. The method of claim 17, wherein a material is utilized to form the electric lines, the material having a coefficient of thermal expansion that is similar to the coefficient of thermal expansion of the polymer material of the first layer.

* * * * *